(12) United States Patent
Golnabi et al.

(10) Patent No.: US 6,691,277 B1
(45) Date of Patent: Feb. 10, 2004

(54) HIGH SPEED PRE-COMPUTING CIRCUIT AND METHOD FOR FINDING THE ERROR-LOCATOR POLYNOMIAL ROOTS IN A REED-SOLOMON DECODER

(75) Inventors: Habibollah Golnabi, Plano, TX (US); Inderpal Deol, deceased, late of San Jose, CA (US), by Gurjeet Kaur Deol, legal representative

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/190,149

(22) Filed: Nov. 12, 1998

(51) Int. Cl.[7] ............................................. H03M 13/15
(52) U.S. Cl. ...................................................... 714/784
(58) Field of Search .......................................... 714/784

(56) References Cited

U.S. PATENT DOCUMENTS

| | | | | |
|---|---|---|---|---|
| 5,107,503 A | * | 4/1992 | Riggle et al. ............... | 371/37.1 |
| 5,563,896 A | * | 10/1996 | Nakaguchi .................. | 371/37.1 |
| 5,699,368 A | * | 12/1997 | Sakai et al. ................. | 371/37.1 |
| 5,818,854 A | * | 10/1998 | Meyer ........................ | 371/37.1 |

OTHER PUBLICATIONS

Shao et al., "On the VLSI Design of a Pipeline Reed–Solomon Decoder Using Systolic Arrays", IEEE Transactions on Computers, vol. 37, No. 10, Oct. 1988, pp. 1273–1280.*

Whiting, "Bit–Serial Reed–Solomon Decoders in VLSI", Calif. Inst. of Technology Ph.D. Thesis 8501350. Pp. 93–98, Dec. 1985.*

Oh et al., "An Efficient Reed–Solomon Decoder VLSI with Erasure Correction", SIPS 97, Nov. 3–5, 1997, pp. 193–201.*

* cited by examiner

*Primary Examiner*—Stephen M. Baker
(74) *Attorney, Agent, or Firm*—Peter Zawilski

(57) ABSTRACT

A system and method used in a Reed-Solomon (RS) decoder for determining roots of error locator polynomials in which a first pre-computation operation is performed to obtain a p-bit polynomial solution value in a first clock cycle and second parallel feedback logical operations are performed to obtain a p-bit polynomial solution value in each subsequent clock cycles. The system excludes constant Galois Field multipliers from the critical timing path of the system so as to facilitate high speed error-locator polynomial root determination. In the case of an unshortened RS(m,d) decoder defined over the Galois Field $GF(2^P)$ where $GF(2^P)$ is a finite field of $2^P$ elements and $m=2^P-1$, final root location values are obtained in m cycles. In the case of a shortened RS(n,d) decoder defined over the Galois Field $GF(2^P)$ where $GF(2^P)$ is a finite field of $2^P$ elements and $m=2^P-1$ and $n<m$, final root location values are obtained in n cycles.

9 Claims, 6 Drawing Sheets

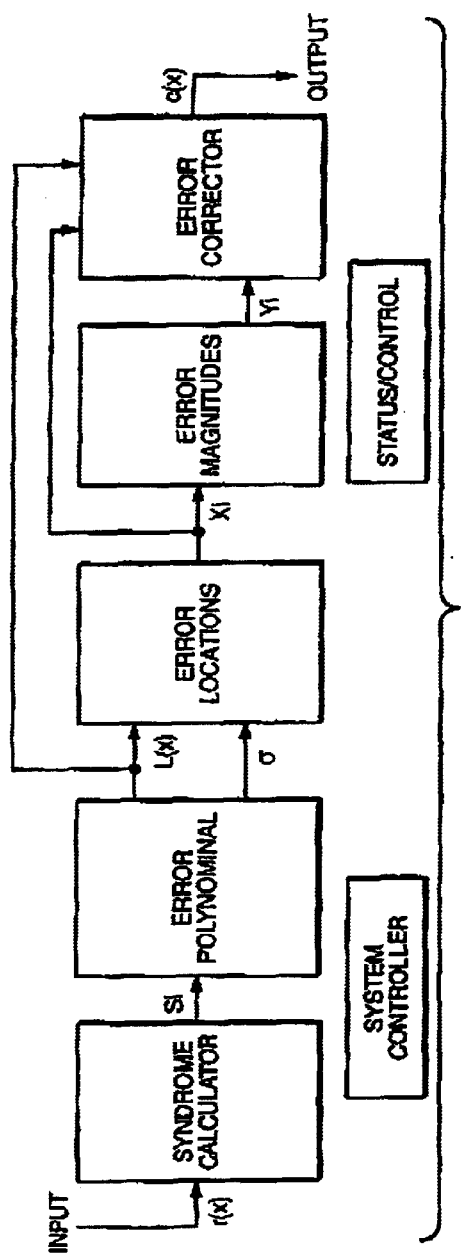
FIG._1A DECODER (Prior Art)
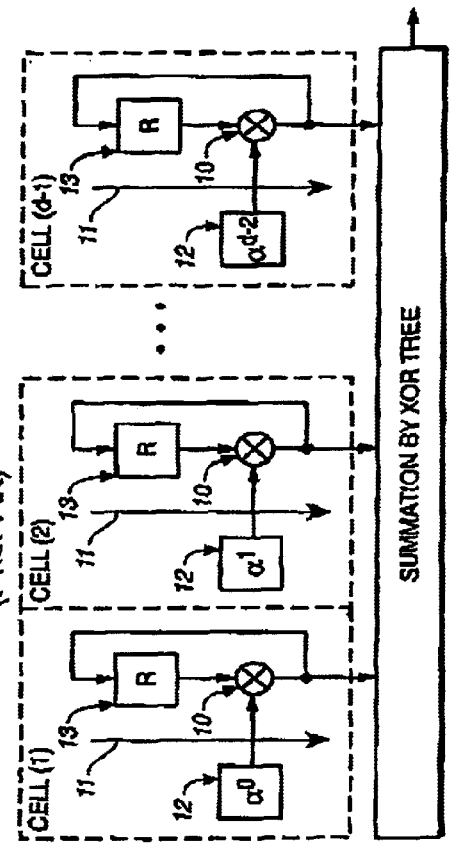
FIG._1B (Prior Art)

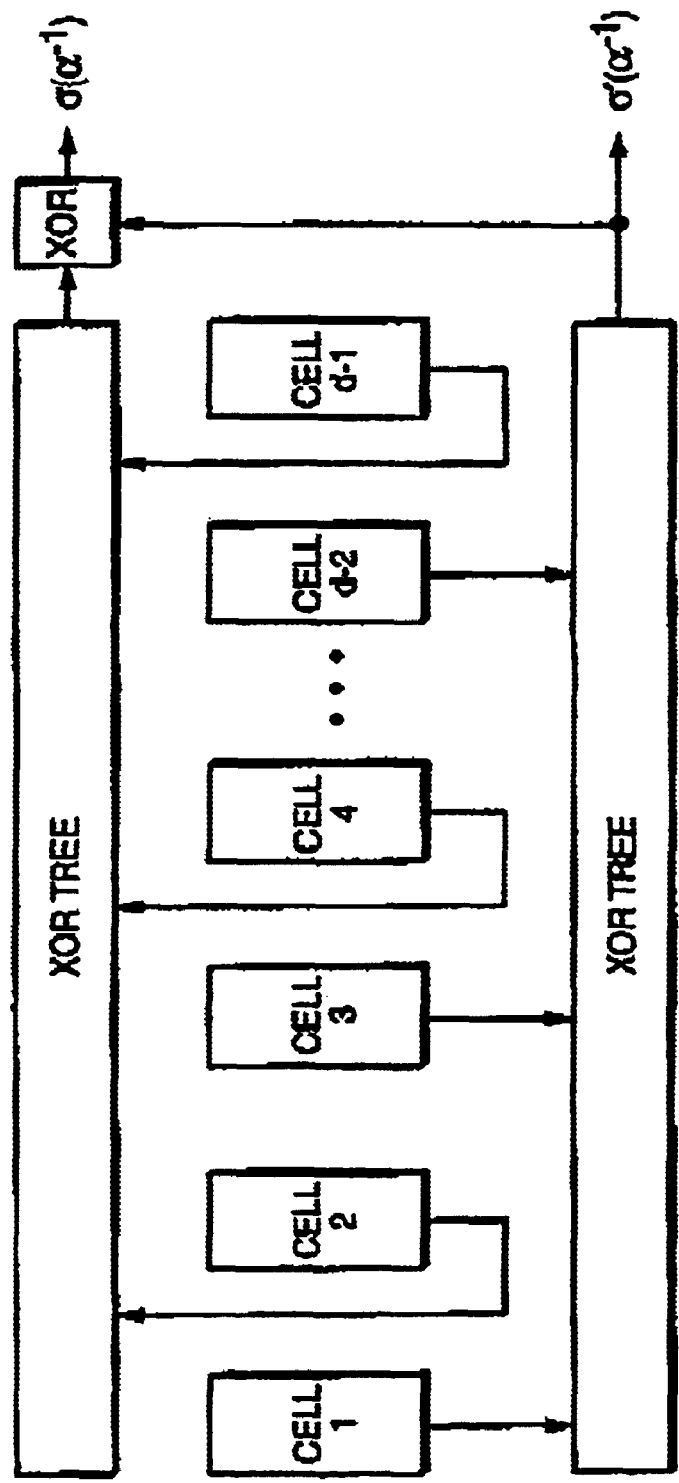
FIG._1C (Prior Art)

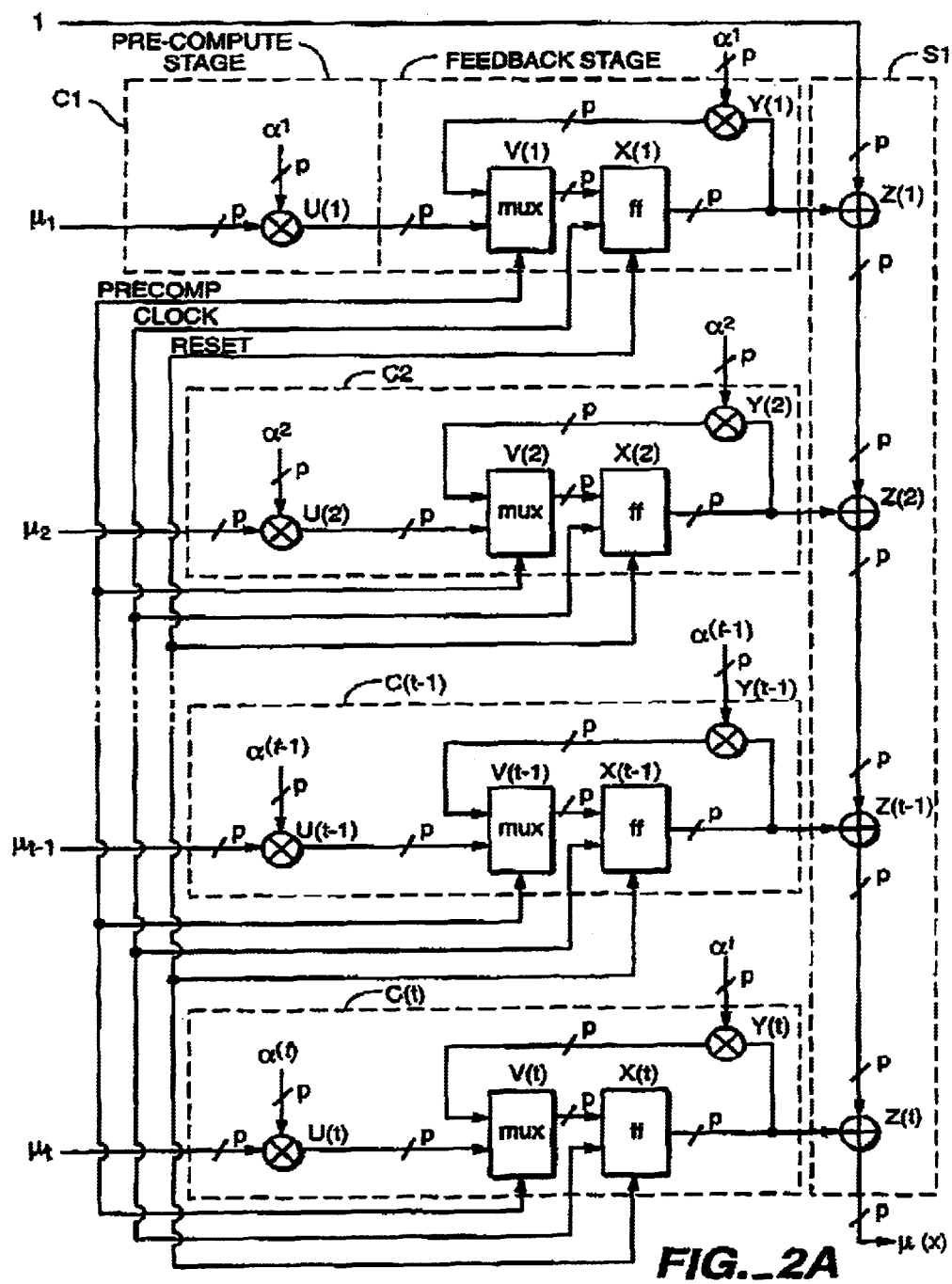
FIG._2A

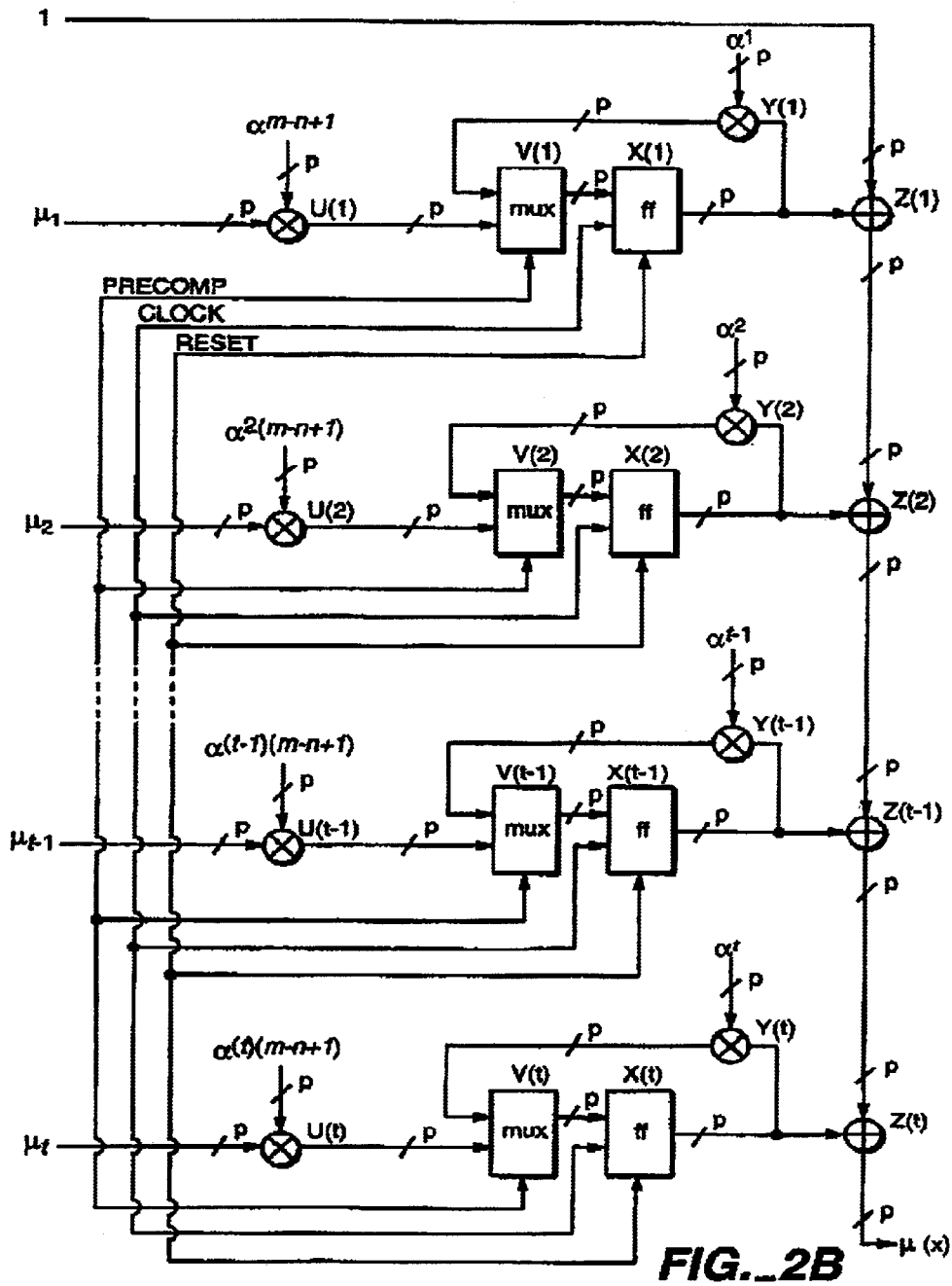
FIG._2B

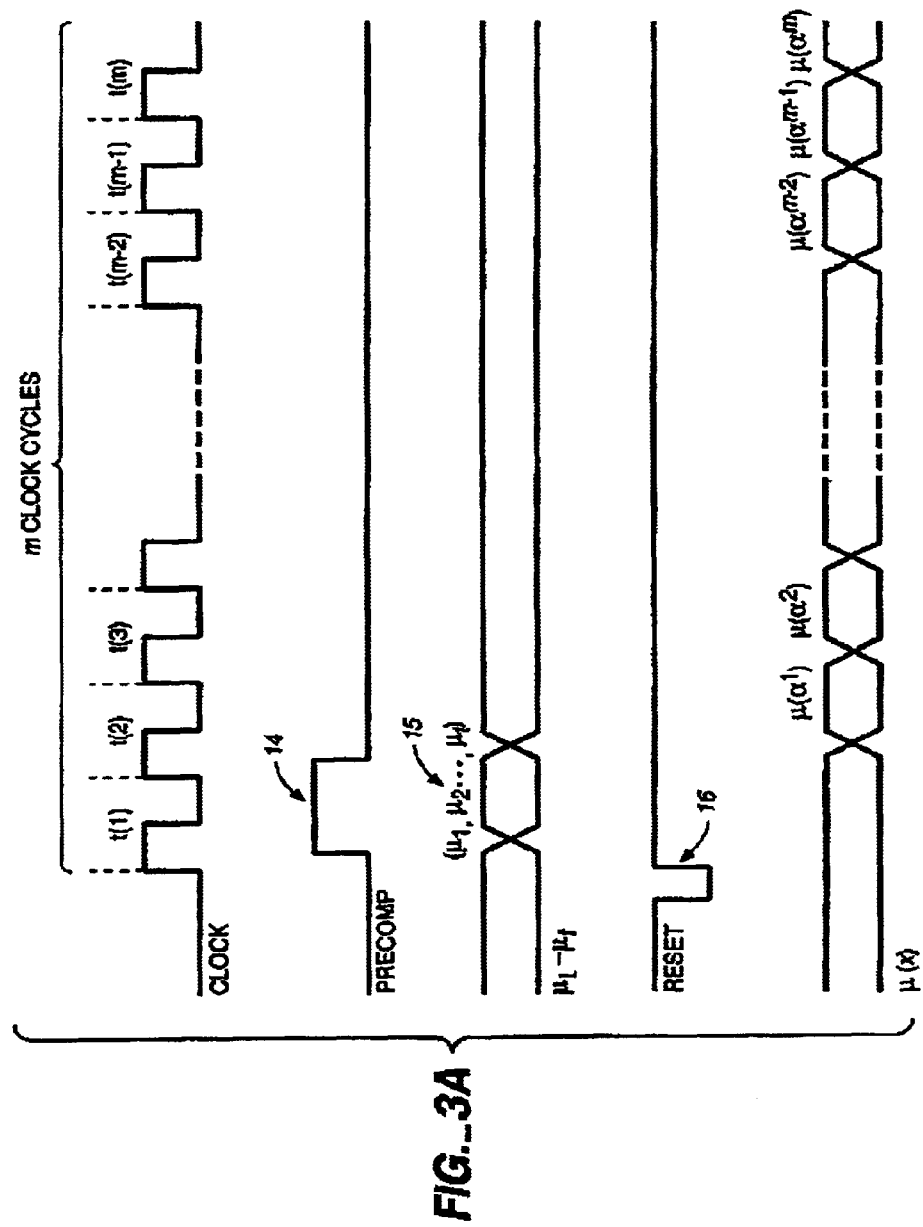
FIG._3A

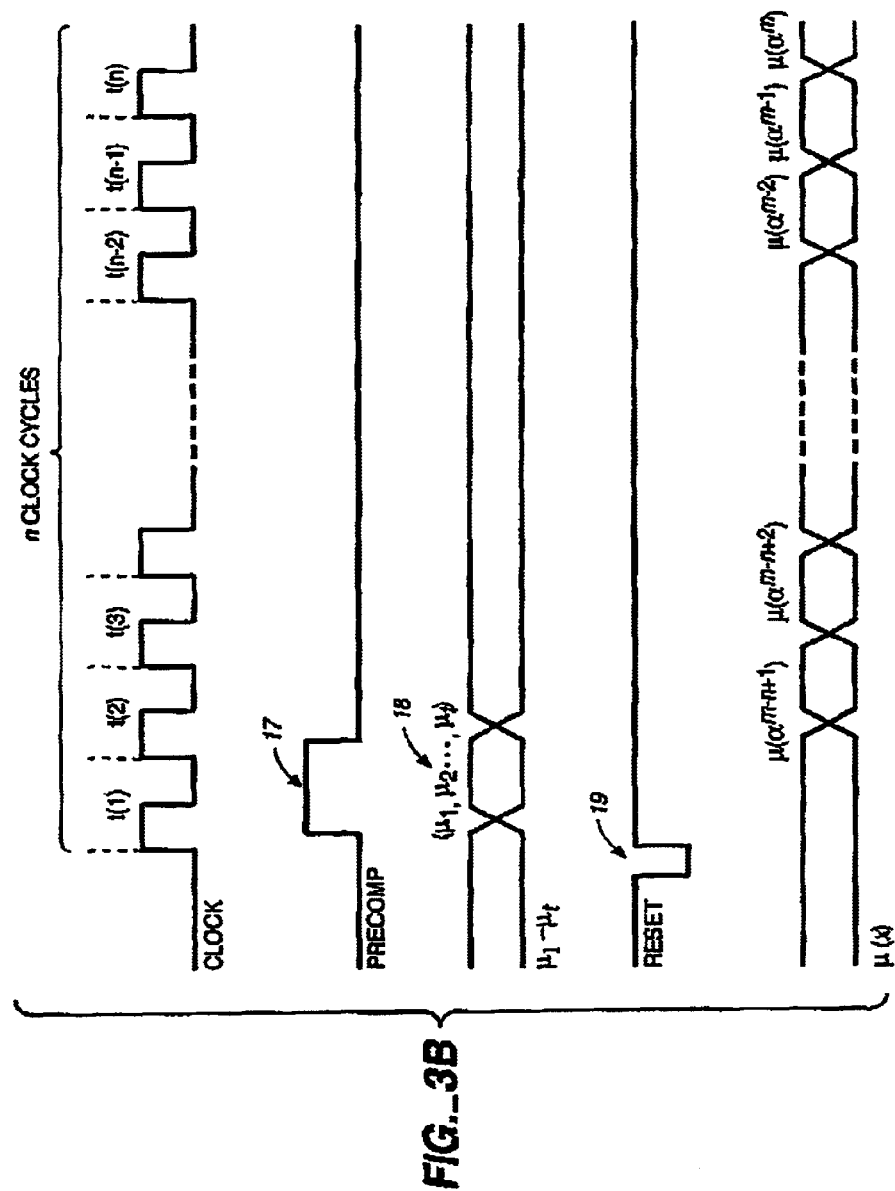
FIG._3B

HIGH SPEED PRE-COMPUTING CIRCUIT AND METHOD FOR FINDING THE ERROR-LOCATOR POLYNOMIAL ROOTS IN A REED-SOLOMON DECODER

BACKGROUND OF THE INVENTION

1. Field of the Invention

The present invention relates to a Reed-Solomon decoder, and more particularly to a polynomial evaluation circuit used to determine error-locator polynomial roots in a Reed-Solomon decoder.

2. State of the Art

Error correction is the process of detecting bit errors and correcting them in a system which transmits information in a binary format. Error correction is implemented by decoding a codeword including information and parity bits to facilitate the detection and correction of the bit errors.

There are several types of error correcting codes used to encode information bits for error detection and/or correction. In particular, the Reed-Solomon error correcting code is a widely implemented code since it has increased error correction capability compared to other known error correcting codes. A typical notation for this type of code is RS(m,d) wherein m is the codeword length and d is the number of information bytes in the codeword.

Reed-Solomon codes are constructed from symbols or bytes (where one byte is equal to p-bits) from a finite or Galois Field (GF) of elements. For instance, a $GF(2^P)$ is a finite field of $2^P$ codewords, where $m=2^P-1$ is the codeword length. The elements of a Reed-Solomon error correcting code which are defined over a Galois field can be represented as polynomials having associated powers and coefficients.

In general, a Reed-Solomon error detection and correction system includes an encoder portion for encoding d information bytes into a codeword of m bytes and a decoder portion for receiving the Reed-Solomon codeword of m bytes for detecting and correcting any errors. FIG. 1 shows one prior art decoder system architecture which can be generally described as a Reed-Solomon forward error correction decoder. A Reed-Solomon decoder includes several stages for evaluating the received codewords to obtain information for performing the error correction/detection. For instance, as shown in FIG. 1, an error polynomial stage determines an error-locator polynomial. This stage is followed by an error locator stage which functions to determine the roots of the error-locator polynomial. The results provided by the error-locator polynomial are then used in the remainder of the decoding system to perform error correction.

Reed-Solomon codes can be characterized as being unshortened or shortened code. In the case of an unshortened code, the number of codewords in the Reed-Solomon code is the same number of possible elements in the Galois Field that the RS code is defined over. In the case of a shortened code, the number of codewords in the Reed-Solomon code is less than the number of possible elements in the Galois Field that the RS code is defined over. Put into mathematical terms, a RS(m,d) unshortened code defined over the Galois Field $GF(2^P)$, where $m=2^P-1$, has a total codeword length of m bytes where d of the bytes are information bytes. A shortened RS(n,k) code, where RS(n,k)=RS(m, m−n+k), defined over the Galois Field $GF(2^P)$, where $m=2^P-1$, has a total codeword length of n bytes with k information bytes.

In the prior art as described in "On the VLSI Design of a Pipeline Reed-Solomon Decoder Using Systolic Arrays", H. M. Shao, I. S. Reed, IEEE Transactions on Computers, vol. C-37, No. 10, pp. 1273–1280, October 1988, and in "Error Control Coding: Fundamentals and Applications", D. J. Costello, S. Lin, New Jersey: Prentice-Hall, 1983, several error-locator polynomial roots determination circuits are proposed. FIGS. 1B and 1C described in "On the VLSI Design of a Pipeline Reed-Solomon Decoder Using Systolic Arrays" show two determination circuits. The circuits include cell(1)–cell(d−1), each utilizing feedback multipliers 10 in the critical timing data path 11 of the circuit. The feedback multipliers 10 represent a significant combinational logic operation of a field element 12 and a coefficient stored in the register device 13. Cell(1)–cell(d−1) shown in FIG. 1C are implemented with the same cell structure as shown in FIG. 1B.

As a result of the manner in which each of the prior art circuits are implemented the overall performance of the determination circuits shown in FIGS. 1B and 1C are degraded. More specifically, the optimal number of clock cycles to determine the error-locator polynomial roots in a real time RS decoder with unshortened code which receives back-to-back input frames (one frame=m data bytes) is m or less clock cycles. Similarly, the optimal number of clock cycles to determine the error-locator polynomial roots in a real time RS decoder with shortened code which receives back-to-back input frames (one frame=n data bytes) is n or less clock cycles. However, since each of the prior art circuit designs include a computation intensive logical multiplication step in a critical timing path it takes more than the above irritated optimal amount of time to determine the error-locator polynomial roots.

The present invention determines the error-locator polynomial roots faster than prior art methods by using a high speed pre-computing stage and eliminating the logical multiplication operation from the critical path.

SUMMARY OF THE INVENTION

The present invention is a system and method of determining error-locator polynomial roots in a Reed-Solomon decoder by evaluating a set of expanded error-locator polynomials. A first embodiment of the system and method are implemented to facilitate decoding of an unshortened Reed-Solomon (RS) error correcting code and a second embodiment of the system and method are implemented to facilitate decoding of a shortened RS code.

The improved system and method of evaluating an error-locator polynomial to determine the error locator roots of the polynomial in a Reed-Solomon decoder includes a pre-computing logical operation step followed by a feedback logical operation step. The pre-computing step obviates the need to include constant Galois Field multipliers in the critical path in the polynomial evaluation circuit thereby resulting in fast error locator root determination.

In the system and method used in a Reed-Solomon (RS) decoder to determine roots of error locator polynomials, a first pre-computation operation is performed to obtain a p-bit polynomial solution value in a first clock cycle and second parallel feedback logical operations are performed to obtain a p-bit polynomial solution value in each subsequent clock cycle. The system excludes constant Galois Field multipliers from the critical timing path of the system so as to facilitate high speed error-locator polynomial root determination. In the case of an unshortened RS(m,d) decoder defined over the Galois Field $GF(2^P)$ where $GF(2^P)$ is a finite field of $2^P$ elements and $m=2^P-1$, final root location values are obtained in m cycles. In the case of a shortened RS(n,d) decoder defined over the Galois Field GF($2^P$) where GF($2^P$) is a finite field of $2^P$ elements and m=$2^P$−1 and n<m, final root location values are obtained in n cycles.

In accordance with one embodiment of the method of error-locator polynomial root determination which is implemented using a RS(m,d) unshortened code defined over a Galois Field GF ($2^P$) where m=$2^P$−1 is the codeword length in bytes, d is the number of information bytes, and t=(m−d)/2 is the number of bytes which can be corrected per codeword. During a first clock cycle, t pre-compute parallel logical operations are performed between t p-bit coefficient values and t p-bit root values to determine a set of t p-bit pre-computed partial resultant values which are stored in t registers and are summed to determine a p-bit value representing a polynomial solution to one of a set of expanded error-locator polynomials. In each of the (m−1) clock cycles subsequent the first clock cycle, a new set of t p-bit partial root location values are determined, stored, and summed to determine (m−1) p-bit polynomial solution values. As a result, root location values for an unshortened Reed-Solomon code (i.e., RS(m,d)) can be determined in a total of m clock cycles.

In accordance with another embodiment of the method of error-locator polynomial root determination which is implemented using a RS(n,k) decoder implemented as a shortened RS(m,m−n+k) code defined over a Galois Field GF ($2^P$) where n is the codeword length in bytes, k is the number of information bytes, and t=(n−k)/2 is the number of bytes which can be corrected per codeword. During a first clock cycle, t initial parallel logical operations are performed between t p-bit coefficient values and t p-bit root values to determine a set of t p-bit partial resultant values which are stored in t registers and are summed to determine a p-bit value representing a polynomial solution to one of a set of expanded error-locator polynomials. In each of the (n−1) clock cycles subsequent the first clock cycle, a new set of t p-bit partial resultant values are determined, stored, and summed to determine (n−1) p-bit polynomial value solutions. As a result, root location values for an unshortened Reed-Solomon code (i.e., RS(n,d)) are determined in a total of n clock cycles.

An embodiment of the system for evaluating an error-locator polynomial includes a plurality of circuit branches, each circuit branch corresponding to one of a plurality of p-bit polynomial root coefficient values and each branch including a pre-computing stage and a feedback loop stage. The pre-computing stage performs an initial logical operation between a p-bit polynomial coefficient value and an initial p-bit root value to generate a p-bit pre-computed partial resultant value in a first clock cycle. The first set of p-bit pre-computed partial resultant values from all of the branches are passed through to a summation stage and are summed to generate a p-bit solution value of a first one of a set of expanded error locator polynomials at the output of the system. After the first clock cycle, the individual branch p-bit pre-computed partial resultant values are fed back to the feedback loop stage in each branch which performs logical operations to generate a new set of p-bit partial resultant values in each subsequent clock cycle. In each subsequent clock cycle, the new set of p-bit resultant value solutions are stored in the registers and are summed to generate a p-bit solution value to each of the remaining expanded error locator polynomials. The p-bit value solutions are then used to determine the roots of the expanded error locator polynomial.

The feedback loop stage is characterized in that due to the pre-computing stage, a constant Galois Field multiplication operation is not performed in the critical timing path of each of the plurality of circuit branches. As a result, root location information for an unshortened RS(m,d) code as defined above are determined in a total of m clock cycles and root location information for a shortened RS(n,k) code as defined above are determined in a total of n clock cycles.

A first embodiment of the system for error-locator polynomial root determination is designed for a decoder using an unshortened code and a second embodiment of the system for error-locator polynomial root determination is designed for a decoder using a shortened code.

BRIEF DESCRIPTION OF THE DRAWINGS

The present invention may be further understood from the following written description in conjunction with the appended drawings. In the drawings:

FIG. 1A is a prior art Reed-Solomon forward error correction decoder;

FIGS. 1B and 1C are prior art implementations of a polynomial evaluation circuit for determining error-locator polynomial roots.

FIG. 2A is a first system embodiment for error-locator polynomial root determination for a decoder using an unshortened code;

FIG. 2B is a second system embodiment for error-locator polynomial root determination for a decoder using a shortened code;

FIG. 3A is the timing diagram for the system embodiment shown in FIG. 2A;

FIG. 3B is the timing diagram for the system embodiment shown in FIG. 2B.

DETAILED DESCRIPTION OF THE PREFERRED EMBODIMENTS

An RS(m,d) decoder is implemented as an unshortened code where m is the codeword length and d is the number of information bytes. Let GF($2^P$) be the finite field of $2^P$ elements and let m=$2^P$−1. The Reed-Solomon (RS) error correcting codes are defined over the Galois Field GF($2^P$). The error-correcting power of an RS(m,d) codeword is related to t=(m−d)/2 where t is the number of bytes which can be corrected per codeword and the difference (m−d) is the number of checkbytes. The general error-locator polynomial for the unshortened RS code of length m is given by equation (1) as shown below:

$$\mu(x) = 1 + \sum_{i=1}^{t} \mu_i x^i \bigg|_{x=\alpha^s} \quad \text{where } s = 1, 2, \ldots, (m-1), (m) \tag{1}$$

Equation (1) can be expanded and expressed as:

$$\mu(x) = 1 + \mu_1 \cdot x^1 + \mu_2 \cdot x^2 + \ldots + \mu_{t-1} \cdot x^{(t-1)} + \mu_t \cdot x^{(t)} \tag{2}$$

Substituting for x=$\alpha^s$ (as indicated in equation 1), equation 2 becomes:

$$\mu(\alpha^s) = 1 + \mu_1 \cdot \alpha^{1(s)} + \mu_2 \cdot \alpha^{2(s)} + \ldots + \mu_{t-1} \cdot \alpha^{(t-1)s} + \mu_t \cdot \alpha^{(t)s} \tag{3}$$

Equation 3 can be further expanded for s=1,2, . . . (m−1), (m), as indicated in equation 1, as follows in equations (4) through (7):

$$\mu(\alpha^1) = 1 + \mu_1 \cdot \alpha^{1(1)} + \mu_2 \cdot \alpha^{2(1)} + \ldots + \mu_{t-1} \cdot \alpha^{(t-1)(1)} + \mu_t \cdot \alpha^{(t)(1)} \tag{4}$$

$$\mu(\alpha^2) = 1 + \mu_1 \cdot \alpha^{1(2)} + \mu_2 \cdot \alpha^{2(2)} + \cdots + \mu_{t-1} \cdot \alpha^{(t-1)(2)} + \mu_t \cdot \alpha^{(t)(2)} \quad (5)$$

$$\vdots$$

$$\mu(\alpha^{m-1}) = \\ 1 + \mu_1 \cdot \alpha^{1(m-1)} + \mu_2 \cdot \alpha^{2(m-1)} + \cdots + \mu_{t-1} \cdot \alpha^{(t-1)(m-1)} + \mu_t \cdot \alpha^{(t)(m-1)} \quad (6)$$

$$\mu(\alpha^m) = 1 + \mu_1 \cdot \alpha^{1(m)} + \mu_2 \cdot \alpha^{2(m)} + \ldots + \mu_{t-1} \cdot \alpha^{(t-1)(m)} + \mu_t \cdot \alpha^{(t)(m)} \quad (7)$$

To determine the roots of the error locator polynomial $\mu(x)$, the expanded equations (4) through (7) are solved to determine each of the $\mu(x)$ values for $x = \alpha^s$ and $s = 1, 2, \ldots (m-1), (m)$. If any of the expanded equations are solved such that $\mu(x) = 0$, then the $\alpha^s$ value substituted into the equation is a root of the error locator polynomial. Each expanded equation (4) through (7) corresponds to the solution of $\mu(x)$ for a given s value. For instance, expanded equation (4) corresponds to $\mu(x)$ for a root value of $\alpha^1$ (i.e., $s = 1$), equation (5) corresponds to $\mu(x)$ for a root value of $\alpha^2$ (i.e, $s = 2$), etc. Once the solutions to the expanded set of error-locator polynomials are determined, the root locations of the error-locator polynomial can also be determined.

FIG. 2A shows one embodiment of a system for evaluating the expanded set of error locator polynomials (equations (4) through (7)) in a Reed-Solomon decoder implemented with an unshortened code. FIG. 3A shows a corresponding timing diagram for FIG. 2A.

The system embodiment shown in FIG. 2A includes a plurality of logic circuit branches C(1), C(2), ... C(t−1), C(t) (each branch including a pre-compute stage and a feedback stage) and a summation stage S1. Each branch corresponds to a portion or term of a given expanded error locator equation. For instance, in the case of equation (4) the C1 branch corresponds to the $\mu_1 \cdot \alpha^{1(1)}$ equation portion, branch C2 corresponds to the $\mu_2 \cdot \alpha^{2(1)}$ equation portion, branch C(t−1) corresponds to the $\mu_1 \cdot \alpha^{(t-1)(1)}$ equation portion, and branch C(t) corresponds to the $\mu_1 \cdot \alpha^{(t)(1)}$ term. In the case of equation (5) the C1 branch corresponds to the $\mu_1 \cdot \alpha^{1(2)}$ term, branch C2 corresponds to the $\mu_2 \cdot \alpha^{2(2)}$ term, branch C(t−1) corresponds to the $\mu_1 \cdot \alpha^{(t-1)(2)}$ term, and branch C(t) corresponds to the $\mu_1 \cdot \alpha^{(t)(2)}$ term.

In general, during a first pre-compute clock cycle, the pre-compute stage generates t p-bit partial resultant values which are stored in the feedback stage and logically summed by the summation stage S1 to generate a p-bit value representing a solution to one of the set of expanded error-locator polynomials. During each of m−1 subsequent clock cycles, the feedback stage generates t p-bit partial resultant values which are stored in the feedback stage and logically summed by the summation stage S1 to generate a p-bit value representing a solution to the remaining set of expanded error-locator polynomials.

As shown in FIG. 3A, each clock cycle generates a $\mu(x)$ for each of the expanded equations (4) through (7). For instance, during the first clock cycle, t(1), $\mu(\alpha^1)$ (i.e., equation 4) is solved. Hence, during the first clock cycle, each branch provides a p-bit partial resultant value which is summed by the summation branch S1 with a p-bit value equal to "1" to provide a p-bit value representing the solution to equation 4, $\mu(x) = \mu(\alpha^1)$. During the second clock cycle t(2), $\mu(\alpha^2)$ is solved such that each branch provides a p-bit partial resultant value corresponding to its term in equation (5) which is summed by the summation branch with a p-bit value "1" to provide a p-bit value representing the solution to equation 5, $\mu(x) = \mu(\alpha^2)$.

Referring to FIGS. 2A and 3A, in a first clock cycle, t(1), p-bit coefficient values $(\mu_1, \mu_2, \ldots, \mu_{t-1}, \mu_t)$ are logically multiplied with p-bit initial condition root values $\{\alpha^1, \alpha^2, \ldots, \alpha^{t-1}, \alpha^t\}$ using logical multipliers U(1), U(2) ... U(t−1), U(t) to generate a first set of t p-bit partial pre-computed values of $(\mu_1 \alpha^{1(1)}, \mu_2 \alpha^{2(1)}, \ldots, \mu_{t-1} \alpha^{(t-1)(1)}, \mu_t \alpha^{(t)(1)})$ (indicated by time period 15, FIG. 3A). Since in the first clock cycle the PRECOMP signal is HIGH (indicated by 14, FIG. 3A), each of the multiplexers V(1), V(2) ... V(t−1), V(t) are set such that the set of p-bit partial pre-computed values are passed through to and stored into the registers X(1), X(2), ... ,X(t). The data stored in each of the registers is passed to each of the summing logic operators Z(1), Z(2), ... ,Z(t) in the summation branch S1. The summation branch logically sums together the set of p-bit partial pre-computed values with a p-bit value equal to "1" to generate a value representing $\mu(x)$ for $x = \alpha^1$.

During the remaining (m−1) clock cycles (i.e., t(2)−t(m), FIG. 3A), the PRECOMP signal stays LOW. As a result, during each remaining clock cycle each of the multiplexers V(1), V(2) ... V(t−1), V(t) are set such that the data resulting from the logical multiplication operation Y(1), Y(2), ... , Y(t) in the feedback path in each branch is passed through the multiplexers V(1), V(2) ... V(t−1), V(t) and is stored into registers X(1), X(2), ... ,X(t). The logical multiplication operation Y(1), Y(2), ... Y(t) consists of a constant Galois multiplication operation of the last value stored in the X(1), X(2), ... , X(t) register multiplied by the branch's initial condition value. Hence, in each of the remaining (m−1) clock cycles a new set of p-bit partial values are generated by the feedback path, loaded into the registers, and summed together by the summation branch such that a new $\mu(x)$ is generated each of the remaining (m−1) clock cycles.

It can be seen from FIG. 2A, that the feedback multipliers Y(1), Y(2), ... , Y(t) are not part of the datapath to the output node $\mu(x)$. Consequently, the worse case path for generating one of the $\mu(x)$ values is the delay starting from the CLOCK input of the X registers through any of the p-bit paths and the summing logic operations Z(1), Z(2), ... Z(t) to the output node $\mu(x)$. The RESET signal asynchronously initializes (i.e., resets) the X(1), X(2), ... ,X(t) registers prior to pre-computation (indicated by 16, FIG. 3A). Hence, it takes m clock cycles to find the p-bit value solutions to the expanded set of polynomials (i.e., equations (4) through (7)).

In the embodiment shown in FIG. 2A the system includes t p-input logical multipliers, U(1), U(2), ... , U(t)}, (t*p) 2×1 multiplexers, {V(1), V(2), ... , V(t)}, (t*p) flip-flop registers, {X(1), X(2), ... ,X(t)}, t p-input feedback multipliers, {Y(1), Y(2), ... ,Y(t)}, and (t*p) 2-input EXOR gates, {Z(1), Z(2), ... ,Z(t)}. It should be noted that the logical multipliers are constant Galois Field GF($2^p$) multipliers and are built with EXOR gates. Constant Galois field multipliers are well known in the field of error detection logic.

FIG. 2B shows an error-locator polynomial evaluation circuit implement in an RS decoder for decoding a shortened RS code. Specifically, the RS (n,k) decoder is implemented as a shortened RS code where n = (m) − (m−n+1) + 1 is the codeword length and k is the number of information bytes. The error-correcting power of an RS(n,k) codeword is related to t = (n−k)/2 where t is the number of bytes which can be corrected per codeword and the difference (n−k) is the number of checkbytes. The general error-locator polynomial for the shortened RS decoder is given in equation 8 below:

$$\mu(x) = 1 + \sum_{i=1}^{t} \mu_i x^i \Big|_{x=\alpha^2} \qquad (8)$$

where $s = (m-n+1), (m-n+2), \ldots, (m-1), (m)$

Equation (8) can be expanded and expressed as:

$$\mu(x) = 1 + \mu_1 \cdot x^1 + \mu_2 \cdot x^2 + \ldots + \mu_{t-1} \cdot x^{(t-1)} + \mu_t \cdot x^{(t)} \qquad (9)$$

Substituting for $x = \alpha^s$ (as indicated in equation 8), equation 9 becomes:

$$\mu(\alpha^s) = 1 + \mu_1 \cdot \alpha^{1(s)} + \mu_2 \cdot \alpha^{2(s)} + \ldots + \mu_{t-1} \cdot \alpha^{(t-1)s} + \mu_t \cdot \alpha^{(t)s} \qquad (10)$$

This can be further expanded out by substituting s values from Equation (8) into Equation (10) as shown below in Equations (11) through (14):

$$\mu(\alpha^{m-n+1}) = 1 + \mu_1 \cdot \alpha^{1(m-n+1)} + \mu_2 \cdot \alpha^{2(m-n+1)} + \ldots + \mu_{t-1} \cdot \alpha^{(t-1)(m-n+1)} + \mu_t \cdot \alpha^{(t)(m-n+1)} \qquad (11)$$

$$\mu(\alpha^{m-n+2}) = 1 + \mu_1 \cdot \alpha^{1(m-n+2)} + \mu_2 \cdot \alpha^{2(m-n+2)} + \cdots + \mu_{t-1} \cdot \alpha^{(t-1)(m-n+2)} + \mu_t \cdot \alpha^{(t)(m-n+2)} \qquad (12)$$

$$\vdots$$

$$\mu(\alpha^{m-1}) = 1 + \mu_1 \cdot \alpha^{1(m-1)} + \mu_2 \cdot \alpha^{2(m-1)} + \cdots + \mu_{t-1} \cdot \alpha^{(t-1)(m-1)} + \mu_t \cdot \alpha^{(t)(m-1)} \qquad (13)$$

$$\mu(\alpha^m) = 1 + \mu_1 \cdot \alpha^{1(m)} + \mu_2 \cdot \alpha^{2(m)} + \ldots + \mu_{t-1} \cdot \alpha^{(t-1)(m)} + \mu_t \cdot \alpha^{(t)(m)} \qquad (14)$$

Similar to the system shown in FIG. 2A, the system shown in FIG. 2B includes a plurality of circuit branches C(1),C(2), . . . , C(t−1),C(t), (each branch having a pre-compute stage and a feedback stage) and a summation stage S1. Furthermore, as with the embodiment shown in FIG. 2A, in the first clock cycle t(1), the PRECOMP signal goes HIGH (indicated by 17, FIG. 3B) and the input coefficients $(\mu_1, \mu_2, \ldots, \mu_t)$ are logically multiplied by their corresponding initial root values $\{\alpha^{1(m-n+1)}, \alpha^{2(m-n+1)}, \ldots, \alpha^{t(m-n+1)}\}$ an p-bit partial pre-computed values (indicated by 18, FIG. 3B) are stored in the X(1), X(2) . . . ,X(t) registers. During the remaining (n−1) clock periods, the PRECOMP signal stays LOW and the feedback multipliers {Y(1), Y(2) . . . , Y(t)} are used for determining the remaining (n−1) p-bit polynomial solution values. It can be seen from FIG. 2B, that similar to the unshortened system shown in FIG. 2A, the feedback multipliers {Y(1), Y(2) . . . , Y(y)} are not part of the datapath to the output node $\mu(x)$. Consequently, the worst-case path is the delay starting from the CLOCK input of the X(1),X(2), . . . ,X(t) registers through any of the p-bit path which includes gates Z(1)–Z(t) to the output node $\mu(x)$. The RESET signal asynchronously initializes the X(1), X(2), . . . ,X(t) registers prior to pre-computation (indicated by 19, FIG. 3B). Hence, it takes n clock cycles to find the p-bit value solutions to the expanded set of error-locator polynomial (e.g., Equations (11) through (14)). The hardware employed in the embodiment shown in FIG. 2B includes t pre-compute logical multipliers, {(U(1), U(2), . . . ,U(t)}, (t*p) 2×1 multiplexers, {V(1), V(2), . . . ,V(t)}, (t*p) registers, {X(1), X(2), . . . ,X(t)}, t logical feedback multipliers, {Y(1), Y(2), . . . ,Y(t)}, and (t*p) 2-input EXOR gates {Z(1), Z(2), . . . ,Z(t)}. The multipliers are constant Galois Field GF($2^p$) multipliers.

In the preceding description, numerous specific details are set forth, such as logic-device type, in order to provide a thorough understanding of the present invention. It will be apparent, however, to one skilled in the art that these specific details need not be employed to practice the present invention. In other instances, well known logic elements and operations have not been described in order to avoid unnecessarily obscuring the present invention.

Moreover, although the components of the present invention have been described in conjunction with a certain embodiment, it is appreciated that the invention can be implemented in a variety of other ways. Consequently, it is to be understood that the particular embodiments shown and described by way of illustration is in no way intended to be considered limiting. Reference to the details of this embodiment is not intended to limit the scope of the claims which themselves recite only those features regarded as essential to the invention.

What is claimed is:

1. A system for evaluating an error locator polynomial in a Reed Solomon (RS) decoder for decoding a RS code having a codeword length of x bytes, said error locator polynomial having an associated set of expanded error locator polynomials, said system comprising:

a plurality of polynomial evaluating circuit branches connected in parallel, each of the branches corresponding to one of a plurality of p-bit polynomial root coefficient values and each branch having:

a first stage for performing logic operations between p-bit values corresponding to polynomial roots and p-bit values corresponding to polynomial coefficients to generate, in each of x clock cycles p-bit values corresponding to partial resultants, said first stage including:

a logical pre-computing stage activated by a logical signal during a first clock cycle for performing logical operations between p-bit coefficient values and p-bit root values thus generating a first set of p-bit values corresponding to a first set of partial resultants associated with a first solution of said expanded error-locator polynomials where said first set of partial resultants are stored in registers and said pre-computing stage is deactivated after said first clock cycle, and wherein said logical pre-computing stage includes parallel logic gates having first inputs coupled to one of said polynomial root bit values and second inputs coupled to one of said polynomial coefficient bit values;

a second stage for, in each subsequent x−1 clock cycles, generating a subsequent set of p-bit values corresponding to a subsequent set of partial p-bit resultants associated with a remaining solution of said expanded error locator polynomials where each of said subsequent resultant values is obtained by multiplying a stored partial resultant calculated during a previous clock cycle to an initial condition value of the second stage;

wherein said second stage includes a critical timing path and a feedback path and wherein said critical timing path is absent any logical operations; and a summation stage interconnecting said plurality of parallel connected polynomial evaluating circuit branches for performing logic operations on said resultant p-bit values to provide, in each of said x clock cycles, a multiple bit value representing a solution to one of said set of expanded error locator polynomials.

2. The system as described in claim 1 wherein said parallel logic gates comprise t p-input logic multipliers where said RS decoder is implemented such that said codeword includes y information bytes, said RS code is defined over the Galois Field $GF(2^P)$; $x=2^P-1$, and $t=x-y/2$.

3. The system as described in claim 1 wherein said RS code is an unshortened code.

4. The system as described in claim 1 wherein said RS code is a shortened code.

5. The system as described in claim 1, wherein said critical timing path includes a multiplexer stage and a storage stage, and said feedback path includes a logical operation stage, said multiplexer stage having a first set of inputs coupled to said pre-computing stage and a second set of inputs coupled to said logical operation stage, wherein in said first clock cycle said multiplexer stage is in a first state so as to pass said pre-computed bit values received from pre-computing stage through said storage stage to said summation stage and in said subsequent clock cycles said multiplexer stage is in a second state so as to pass resultant partial bit values received from said logical operation stage through said storage stage to said summation stage.

6. The system as described in claim 5 wherein said multiplexer stage 20 comprises (t*p) 2×1 multiplexers where said RS decoder is implemented such that said codeword includes y information bytes, said RS code is defined over the Galois Field $GF(2^P)$, $x=2^P-1$ and $t=x-y/2$.

7. The system as described in claim 5 wherein said storage stage comprises (t*p) registers where said RS decoder is implemented such that said codeword includes y information bytes, said RS code is defined over the Galois Field $GF(2^P)$, $x=2^P-1$ and $t=x-y/2$.

8. The system as described in claim 5 wherein said logical operations stage performs constant Galois multiplication operations.

9. The system as described in claim 8 wherein said constant Galois multiplication operations are implemented with exclusive OR logic gates.

* * * * *